US008021717B2

(12) United States Patent
Murakami et al.

(10) Patent No.: US 8,021,717 B2
(45) Date of Patent: Sep. 20, 2011

(54) FILM FORMATION METHOD, CLEANING METHOD AND FILM FORMATION APPARATUS

(75) Inventors: Seishi Murakami, Nirasaki (JP); Masaki Koizumi, Nirasaki (JP); Hiroaki Ashizawa, Nirasaki (JP); Masato Koizumi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 9 days.

(21) Appl. No.: 12/352,197

(22) Filed: Jan. 12, 2009

(65) Prior Publication Data
US 2009/0142513 A1 Jun. 4, 2009

Related U.S. Application Data

(63) Continuation of application No. PCT/JP2007/063754, filed on Jul. 10, 2007.

(30) Foreign Application Priority Data

Jul. 11, 2006 (JP) ................................. 2006-190882

(51) Int. Cl.
*C23C 16/08* (2006.01)
(52) U.S. Cl. ............ 427/255.39; 427/255.391; 427/534; 427/569; 134/1.2
(58) Field of Classification Search .................. 427/569, 427/255.39, 255.391, 534; 134/1, 2, 1.2
See application file for complete search history.

(56) References Cited

U.S. PATENT DOCUMENTS

| 5,709,757 | A | * | 1/1998 | Hatano et al. ............... 134/22.14 |
| 5,849,092 | A | * | 12/1998 | Xi et al. .......................... 134/1.1 |
| 5,963,834 | A | | 10/1999 | Hatano et al. |
| 5,983,906 | A | | 11/1999 | Zhao et al. |
| 6,042,654 | A | * | 3/2000 | Comita et al. ..................... 134/2 |
| 6,051,286 | A | | 4/2000 | Zhao et al. |
| 6,189,482 | B1 | | 2/2001 | Zhao et al. |
| 2001/0054381 | A1 | * | 12/2001 | Umotoy et al. ............... 118/715 |
| 2003/0034053 | A1 | * | 2/2003 | Nishimura et al. ............. 134/19 |

(Continued)

FOREIGN PATENT DOCUMENTS

JP 10-189488 7/1998

(Continued)

OTHER PUBLICATIONS

Korean Office Action issued Mar. 3, 2011, in Korean Application No. 10-2009-7000522, (with English-language translation).

*Primary Examiner* — Bret Chen
(74) *Attorney, Agent, or Firm* — Oblon, Spivak, McClelland, Maier & Neustadt, L.L.P.

(57) ABSTRACT

A treatment gas is supplied to form a Ti-based film on a predetermined number of wafers W while setting a temperature of a susceptor 2 in a chamber 1 to a predetermined temperature. After this, the interior of the chamber 1 containing no wafers W is cleaned by discharging $Cl_2$ gas as a cleaning gas from a shower head 10 into the chamber 1. During this cleaning, the temperature of each of the susceptor 2, the shower head 10, and the wall portion of the chamber 1 is independently controlled so that the temperature of the susceptor 2 is not lower than the decomposition start temperature of $Cl_2$ gas and the temperature of the shower head 10 and the wall portion of the chamber 1 is not higher than the decomposition start temperature.

16 Claims, 11 Drawing Sheets

U.S. PATENT DOCUMENTS

2006/0042544 A1 * 3/2006 Hasebe et al. ................ 118/715
2009/0087542 A1 * 4/2009 Sasaki et al. ..................... 427/8
2009/0321692 A1 * 12/2009 LoCascio et al. .......... 252/518.1

FOREIGN PATENT DOCUMENTS

| | | |
|---|---|---|
| JP | 10-256192 | 9/1998 |
| JP | 10-312976 | 11/1998 |
| JP | 2001-185489 | 7/2001 |
| JP | 2003-203907 | 7/2003 |
| JP | 2004-39788 | 2/2004 |
| JP | 2004-83983 | 3/2004 |

* cited by examiner

UNPROCESSED

Cl₂

ClF₃

FILM FORMATION METHOD, CLEANING METHOD AND FILM FORMATION APPARATUS

This application is a Continuation application of PCT International Application No. PCT/JP2007/063754 filed on 10 Jul. 2007, which designated the United States.

FIELD OF THE INVENTION

The present invention relates to a film formation method for forming a metal film or a metal compound film on a surface of a target substrate provided in a chamber by discharging a processing gas containing a metal chloride compound gas such as $TiCl_4$ gas or the like from a shower head into the chamber, a method for cleaning an interior of a chamber where the film forming method is carried out, and a film formation apparatus.

BACKGROUND OF THE INVENTION

In a manufacturing process of a semiconductor apparatus, various gas processes such as a film forming process, an etching process and the like are performed on a semiconductor wafer as a target substrate (hereinafter, referred to as a "wafer"). These gas processes are carried out by supplying a reactant gas (corrosion gas), e.g., a processing gas containing halogen, e.g., Cl, F or the like, from a shower head provided at an upper portion of a chamber accommodating therein a wafer while depressurizing the interior of the chamber. For example, in a CVD film forming process for forming a Ti-based film, e.g., Ti, TiN or the like, the film forming process is performed by introducing $TiCl_4$ gas as a processing gas (film forming gas), a reduction gas and the like into a chamber in a predetermined depressurized atmosphere. At this time, a wafer is heated to, e.g., about 450 to 700° C., and the processing gas is converted into a plasma, if necessary.

When the film forming process is repetitively carried out, by-products are adhered to a shower head, a chamber wall and the like. These adhered by-products are peeled off and become particles. Therefore, dry cleaning is performed by supplying a cleaning gas into a chamber regularly or when necessary. Further, as for a cleaning gas, $ClF_3$ gas is widely used because it can almost completely clean an interior of a chamber without a plasma (e.g., Japanese Patent Laid-open Application No. H10-189488).

However, $ClF_3$ gas easily reacts with Al, Ni, Ni-based alloy as a material forming a chamber in a processing apparatus, and carbon, SiN, AlN or the like as a material for forming a heater or a stage of a substrate. For that reason, a cleaning temperature needs to be decreased to about 200° C. Accordingly, a period of time to increase or decrease the temperature in the chamber is required between the film formation and the cleaning, thus severely deteriorating the productivity of the semiconductor apparatus manufacturing process.

Meanwhile, Japanese Patent Laid-open Application No. H10-312976 describes a technique in which $Cl_2$ gas is used as a cleaning gas and a cleaning temperature is about 625° C. The cleaning temperature thereof is higher than that of $ClF_3$ gas, and the cleaning can be performed near the film forming temperature. Hence, it is considered that the productivity does not deteriorate.

However, the technique described in Japanese Patent Laid-open Application No. H10-312976 does not specify the detailed conditions of the cleaning process. Further, it is unrealistic to completely remove the by-products, or damages are inflicted on the chamber wall or in-chamber members.

Besides, regardless of the existence of the above Patent Document, the cleaning process using a chlorine-based gas such as $Cl_2$ gas or the like has not been practically employed.

SUMMARY OF THE INVENTION

In view of the above, the present invention provides a film formation, a cleaning method and a film formation apparatus which are capable of completely cleaning a cleaning target portion without inflicting damages on a chamber wall and the like when a metal film or a metal compound film is formed by using, as a processing gas, a metal chloride compound gas such as $TiCl_4$ or the like.

In accordance with a first aspect of the present invention, there is provided, a film formation method including: forming a metal film or a metal compound film by CVD on a surface of a target substrate mounted on a substrate mounting table in a chamber by discharging a processing gas containing a metal chloride compound gas from a gas ejection member provided in the chamber in a state where an interior of the chamber is exhausted and a temperature of the substrate mounting table is set to a predetermined temperature; and cleaning the interior of the chamber by discharging a cleaning gas containing $Cl_2$ gas from the gas ejection member into the chamber containing no target substrate.

During the cleaning process, temperatures of the susceptor mounting table, the gas ejection member and a wall portion of the chamber are independently controlled so that a temperature of a cleaning target portion is not lower than a decomposition start temperature of $Cl_2$ gas and a temperature of a non-cleaning target portion is not higher than the decomposition start temperature.

In accordance with the first aspect, the metal chloride compound gas may be $TiCl_4$ gas, and the metal may be Ti.

Further, in accordance with the first aspect, the processing gas may contain $TiCl_4$ gas and nitrogen-containing gas. In the film forming process, a TiN film as a metal compound film may be formed by thermal CVD on the surface of the target substrate while setting the temperature of the substrate mounting table to be in a range from about 400 to 700° C. and the temperatures of the gas ejection member and the wall portion of the chamber to be in a range from about 150 to 250° C. at which a by-product is hardly adhered.

In the cleaning process, the substrate mounting table may be the cleaning target portion, so that the temperature thereof is controlled to be higher than or equal to a decomposition start temperature of $Cl_2$ gas, and the gas ejection member and the wall portion of the chamber may be the non-cleaning target portions, so that the temperatures thereof are controlled to a temperature lower than the decomposition start temperature of $Cl_2$ gas and close to a film forming temperature.

Further, the processing gas may contain $TiCl_4$ gas and a reduction gas, and in the film forming process, a Ti film as a metal film may be formed by plasma CVD on the surface of the target substrate while setting the temperatures of the substrate mounting table, the gas ejection member and the wall portion of the chamber to be from about 400 to 700° C., be from about 400 to 500° C. and be from about 150 to 250° C., respectively.

In the cleaning process, the substrate mounting table and the gas ejection member may be the cleaning target portions, so that the temperatures thereof are controlled to be higher than or equal to a decomposition start temperature of $Cl_2$ gas and the wall portion of the chamber may be the non-cleaning target portion, so that the temperature thereof is controlled to be lower than or equal to the decomposition start temperature.

Further, the cleaning process, the decomposition start temperature of $Cl_2$ gas may be controlled by controlling a pressure in the chamber.

In the cleaning process, a pressure in the chamber may be controlled so that the decomposition start temperature of $Cl_2$ gas becomes a predetermined temperature depending on the temperature of the cleaning target portion.

Further, in the cleaning process, the cleaning of the wall portion of the chamber may be assisted by converting the cleaning gas into a plasma. In that case, the cleaning gas is preferably converted into a plasma by using a remote plasma. The cleaning gas may further contain a reducing agent, or may further contain $ClF_3$ gas. Further, the cleaning process is preferably performed while setting the temperature of the cleaning target portion to a temperature close to the film forming temperature.

In accordance with a second aspect of the present invention, there is provided a cleaning method for cleaning an interior of a chamber after forming a metal film or a metal compound film on a surface of a target substrate mounted on a substrate mounting table in a chamber by discharging a processing gas containing a metal chloride compound gas from a gas ejection member provided in the chamber while exhausting the interior of the chamber and setting a temperature of the substrate mounting table to a predetermined temperature.

A cleaning gas containing $Cl_2$ is introduced into the chamber containing no target substrates while controlling the temperatures of the substrate mounting table, the ejection member and the wall portion of the chamber independently so that a temperature of a cleaning target portion is higher than or equal to a decomposition start temperature of $Cl_2$ gas and a temperature of a non-cleaning target portion is lower than the decomposition start temperature of $Cl_2$ gas.

In accordance with the second aspect, the metal chloride compound gas may be $TiCl_4$ gas, and the metal may be Ti.

Further, the decomposition start temperature of $Cl_2$ gas may be controlled by controlling a pressure in the chamber, or the decomposition start temperature of $Cl_2$ gas may become a predetermined temperature depending on the temperature of the cleaning target portion by controlling a pressure in the chamber.

Further, the cleaning of the wall portion of the chamber is preferably assisted by converting the cleaning gas into a plasma. In that case, the cleaning gas is preferably converted into a plasma by using a remote plasma. The cleaning gas may further contain a reducing agent, or may further contain $ClF_3$ gas. Further, the cleaning process is preferably performed while setting the temperature of the cleaning target portion to a temperature close to the film forming temperature.

In accordance with a third aspect of the present invention, a film formation apparatus for forming a metal film or a metal compound film on a surface of a target substrate, the film formation apparatus including: a chamber accommodating therein the target substrate; a substrate mounting table for mounting thereon the target substrate in the chamber; a processing gas supply mechanism for supplying a processing gas containing a metal chloride compound gas into the chamber; a cleaning gas supply mechanism for supplying a cleaning gas containing $Cl_2$ gas into the chamber; a gas ejection mechanism provided in the chamber, for discharging the processing gas and the cleaning gas into the chamber; and a heating mechanism for heating the substrate mounting table, the gas ejection member, and the wall portion of the chamber independently.

The apparatus further includes a control mechanism for controlling, during the supply of the cleaning gas, the temperatures of the substrate mounting table, the gas ejection member, and the wall portion of the chamber independently so that a temperature of a cleaning target portion becomes higher than or equal to a decomposition start temperature of $Cl_2$ gas and a temperature of a non-cleaning target portion becomes lower than the decomposition start temperature.

In accordance with the third aspect, the processing gas supply mechanism may supply $TiCl_4$ gas as the metal chloride compound gas, so that a Ti film or a Ti compound film is formed.

Further, the control mechanism may control the decomposition start temperature of $Cl_2$ gas by controlling a pressure in the chamber or the control mechanism may control the pressure in the chamber so that the decomposition start temperature of $Cl_2$ gas becomes a predetermined temperature depending on the temperature of the cleaning target portion.

The film formation apparatus may further include a plasma generation mechanism for converting the processing gas into a plasma. Moreover, the film formation apparatus may further include a mechanism for plasma generation for assisting the cleaning by converting the cleaning gas into a plasma. In this case, the mechanism for plasma generation preferably has a remote plasma source. The cleaning target portion may be made of Al compound, Ni or Ni compound. The cleaning gas supply mechanism may supply a cleaning gas containing a reducing agent, or supply a cleaning gas containing $ClF_3$ gas. Further, the control mechanism preferably controls the temperature of the cleaning target portion to a temperature close to a film forming temperature.

In accordance with a fourth aspect, there is provided a storage medium operated on a computer to store therein a program for controlling a film formation apparatus, wherein the program, when executed, controls the film formation apparatus on a computer to perform a film formation method including: forming a metal film or a metal compound film by CVD on a surface of a target substrate mounted on a substrate mounting table in a chamber by discharging a processing gas containing a metal chloride compound gas from a gas ejection member provided in the chamber while exhausting an interior of the chamber and setting a temperature of the substrate mounting table is to a predetermined temperature; and cleaning the interior of the chamber by discharging a cleaning gas containing $Cl_2$ gas from the gas ejection member into the chamber containing no target substrate.

During the cleaning process, temperatures of the susceptor mounting table, the gas ejection member and a wall portion of the chamber are independently controlled so that a temperature of a cleaning target portion is not lower than a decomposition start temperature of $Cl_2$ gas and a temperature of a non-cleaning target portion is not higher than the decomposition start temperature.

In accordance with the present invention, $Cl_2$ gas that is less active than conventionally used $ClF_3$ gas but is highly reactive with a material adhered in the chamber is used as a cleaning gas, and the cleaning is performed by independently controlling the temperature of each of the substrate mounting table, the gas ejection member and the wall portion of the chamber so that the temperature of the cleaning target portion is not lower than the decomposition start temperature of $Cl_2$ gas and the temperature of the non-cleaning target portion is not higher than the decomposition start temperature. As a consequence, the cleaning target portion can be reliably cleaned without inflicting damages on the chamber wall and the like.

DETAILED DESCRIPTION OF THE EMBODIMENT

The embodiments of the present invention will be described with reference to the accompanying drawings.

Figure 1:
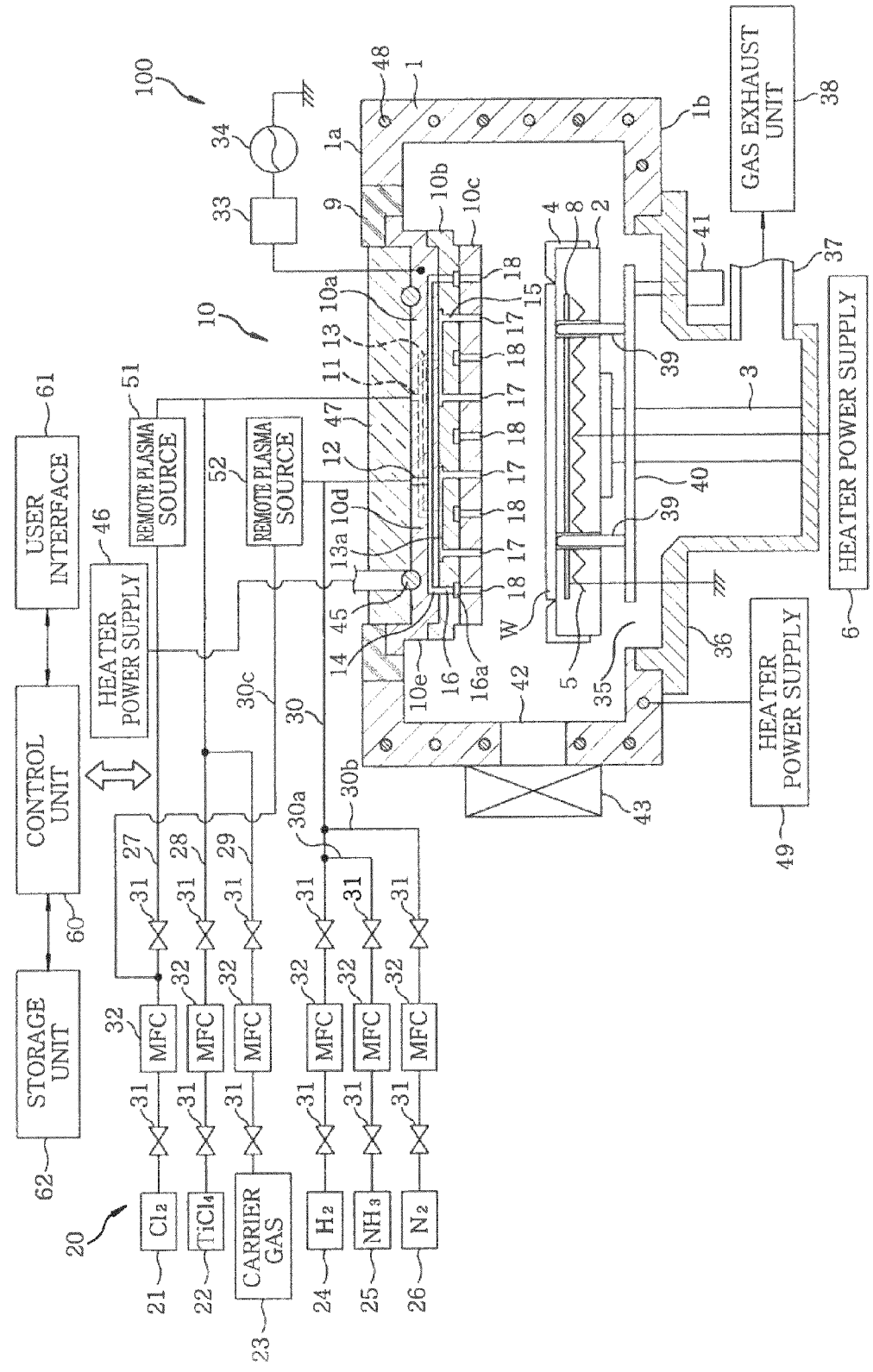
FIG. 1 shows a schematic cross sectional view of an example of a Ti film formation apparatus used for implementing a Ti-based film forming method in accordance with an embodiment of the present invention.

FIG. 1 shows a schematic cross sectional view of an example of a film formation apparatus used for implementing a Ti-based film forming method in accordance with an embodiment of the present invention. A TiN film formation apparatus and a Ti film formation apparatus have similar configuration. Therefore, the film formation apparatus employed herein is applicable to the TiN film formation and the Ti film formation.

A Ti film formation apparatus 100 includes a substantially cylindrical chamber 1. The chamber 1 is made of, e.g., aluminum or aluminum alloy (e.g., JIS A5052). In the chamber 1, a susceptor (stage) 2 for horizontally supporting a wafer W as a target substrate is disposed while being supported by a cylindrical supporting member 3 provided at a center of a lower portion thereof. The susceptor 2 is made of ceramics, e.g., AlN or the like, and a heater 5 is embedded therein. The heater 5 heats the wafer W as a target substrate to a predetermined temperature, e.g., about 400 to 700° C., by a power supplied from a heater power supply 6. A guide ring 4 for guiding the wafer W is provided on an outer peripheral portion of the susceptor 2. The guide ring 4 is made of, e.g., $Al_2O_3$. Further, an electrode 8 serving as a lower electrode of parallel plate electrodes is buried near the surface of the susceptor 2. This electrode 8 is grounded.

A shower head 10 serving as an upper electrode of the parallel plate electrodes is provided at a ceiling wall 1a of the chamber 1 via an insulating member 9. The shower head 10 includes an upper block body 10a, an intermediate block body 10b and a lower block body 10c, and has a substantially disk shape. The upper block body 10a of a recess shape has a horizontal portion 10d forming a shower head main body together with the intermediate block body 10b and the lower block body 10c and an annular supporting portion 10e extending upward from the outer circumference of the horizontal portion 10d. Moreover, the entire shower head 10 is supported by the annular supporting portion 10e.

The shower head 10 is made of Al or Al alloy when the film formation apparatus 100 is used as a apparatus for forming a TiN film by thermal CVD, and is made of a material containing Ni, typically pure Ni or Ni-based alloy, when it is used as a apparatus for forming a Ti film by plasma CVD. In addition, gas ejection openings 17 and 18 are alternately formed in the lower block body 10c.

A first gas inlet port 11 and a second gas inlet port 12 are formed on the top surface of the upper block body 10a. In the upper block body 10a, a plurality of gas channels 13 are branched from the first gas inlet port 11. A gas channel 15 is formed in the intermediate block body 10b, and communicates with the gas channels 13 via a horizontally extending communication path 13a. Further, the gas channel 15 communicates with the gas ejection openings 17 of the lower block body 10c. Besides, in the upper block body 10a, a plurality of gas channels 14 are branched from the second gas inlet port 12. A gas channel 16 is formed in the intermediate block body 10b, and communicates with the gas channels 14. Moreover, the gas channel 16 is connected to a communication path 16a extending horizontally in the intermediate block body 10b, and the communication path 16a communities with the gas ejection openings 18 of the lower block body 10c. Furthermore, the first and the second gas inlet port 11 and 12 are connected to gas lines of a gas supply unit 20.

The gas supply unit 20 includes a $Cl_2$ gas supply source 21 for supplying $Cl_2$ gas as a cleaning gas, a $TiCl_4$ gas supply source 22 for supplying $TiCl_4$ gas as a Ti compound gas, a carrier gas supply source 23 for supplying a carrier gas, an $H_2$ gas supply source 24 for supplying $H_2$ gas as a reduction gas, an $NH_3$ gas supply source 25 for supplying $NH_3$ gas as a nitriding gas, and an $N_2$ gas supply source 26 for supplying $N_2$ gas. Further, the $Cl_2$ gas supply source 21 is connected to $Cl_2$ gas supply lines 27 and 30c; the $TiCl_4$ gas supply source 22 is connected to a $TiCl_4$ gas supply line 28; the carrier gas supply source 23 is connected to a carrier gas supply line 29; the $H_2$ gas supply source 24 is connected to an $H_2$ gas supply line 30; the $NH_3$ gas supply source 25 is connected to an $NH_3$ gas supply line 30a; and the $N_2$ gas supply source 26 is connected to an $N_2$ gas supply line 30b. Moreover, each of the gas supply lines is provided with a mass flow controller 32 and two valves 31 positioned on either side of the mass flow controller 32. The $Cl_2$ gas supply lines 27 and 30c are provided with remote plasma sources 51 and 52, respectively. Accordingly, $Cl_2$ gas as a cleaning gas circulating in the $Cl_2$ gas supply lines 27 and 30c can be converted into a plasma.

The first gas inlet port 11 is connected to the $TiCl_4$ gas supply line 28 extending from the $TiCl_4$ gas supply source 22. The $TiCl_4$ gas supply line 28 is connected to the $Cl_2$ gas supply line 27 extending from the $Cl_2$ gas supply source 21 and the carrier gas supply line 29 extending from the carrier gas supply source 23. Further, the second gas inlet port 12 is connected to the $H_2$ gas supply line 30 extending from the $H_2$ gas supply source 24. The $H_2$ gas supply line 30 is connected to the $NH_3$ gas supply line 30a extending from the $NH_3$ gas supply source 25, the $N_2$ gas supply line 30b extending from the $N_2$ gas supply source 26, and the $Cl_2$ gas supply line 30c extending from the $Cl_2$ gas supply source 21. The carrier gas supply source 23 supplies $N_2$ gas when a TiN film is formed, or supplies Ar gas when a Ti film is formed.

In the TiN film forming process, $TiCl_4$ gas from the $TiCl_4$ gas supply source 22 and $N_2$ gas as a carrier gas are supplied into the shower head 10 from the first gas inlet port 11 of the shower head 10 via the $TiCl_4$ gas supply line 28, and then are ejected into the chamber 1 from the gas ejection openings 17 via the gas channels 13 and 15. $NH_3$ gas from the $NH_3$ gas supply source 25 is supplied into the shower head 10 from the second gas inlet port 12 of the shower head 10 via the $NH_3$ gas supply line 30a and the $H_2$ gas supply line 30, and then is ejected into the chamber 1 from the gas ejection openings 18 via the gas channels 14 and 16.

During the Ti film forming process, $TiCl_4$ gas is ejected from the shower head 10 into the chamber 1 via the $TiCl_4$ gas supply line 28, together with Ar gas as a carrier gas from the carrier gas supply source 23, as in the TiN film forming process. $H_2$ gas from the $H_2$ gas supply source 24 is supplied into the shower head 10 from the second gas inlet port 12 of the shower head 10 via the $H_2$ gas supply line 30, and then is ejected into the chamber 1 from the gas ejection openings 18 via the gas channels 14 and 16.

In other words, the shower head 10 is of a post-mix type in which $TiCl_4$ gas and $NH_3$ or $H_2$ gas are supplied into the chamber 1 separately from each other. These gases react with each other after they are ejected and mixed. However, the shower head 10 is not limited thereto, and may be of a pre-mix type in which $TiCl_4$ gas and $NH_3$ gas or $H_2$ gas are mixed and supplied into the chamber 1.

During the cleaning process, $Cl_2$ gas is introduced into the shower head 10 from the first and the second gas inlet port 11 and 12 via lines 28 and 30 from the $Cl_2$ gas supply lines 27 and 30c.

Moreover, the lines of the gas supply unit 20 are made of Ni-based stainless steel (e.g., SUS316L).

The showerhead 10 is connected to a high frequency power supply 34 via a matching unit 33, and a high frequency power is supplied from the high frequency power supply 34 to the shower head 10. By supplying the high frequency power from the high frequency power supply 34, the gas supplied into the chamber 1 via the shower head 10 is turned into a plasma and, thus, a film forming process can be performed. When the TiN film is formed, the film formation can be performed sufficiently by thermal energy and, thus, the high frequency power from the high frequency power supply 34 is basically not required. On the other hand, when the Ti film is formed, the processing gas is turned into a plasma by supplying the high frequency power from the high frequency power supply 34.

Further, a heater 45 for heating the shower head 10 is provided at the horizontal portion 10d of the upper plate 10a of the shower head 10, and a heater power supply 46 is connected to the heater 45. By supplying a power from the heater power supply 46 to the heater 45, the shower head 10 is heated to a desired temperature. An insulating member 47 is provided on the recess of the upper plate 10a in order to increase heating efficiency of the heater 45. The heating temperature of the shower head 10 is in a range from about 150 to 250° C. during the TiN film formation, and is higher than or equal to about 400° C. during the Ti film formation.

A circular opening 35 is formed at a central portion of a bottom wall 1b of the chamber 1. A gas exhaust chamber 36, which is made of, e.g., Al or Al alloy, is provided with the bottom wall 1b and projects downward to cover the opening 35. A gas exhaust line 37 is connected to a side surface of the gas exhaust chamber 36, and is also connected to a gas exhaust unit 38. By operating the gas exhaust unit 38, the interior of the chamber 1 can be depressurized to a predetermined vacuum level.

The susceptor 2 is provided with three (only two of them are shown) wafer support pins 39 for supporting and vertically moving the wafer W. The wafer support pins 39 are fixed on a support plate 40 and can project and retreat with respect to the surface of the susceptor 2. The wafer support pins 39 are raised and lowered via the support plate 40 by a driving mechanism 41 such as an air cylinder or the like. Further, the wafer supporting pins are made of ceramics, e.g., $Al_2O_3$ or the like.

Provided at the sidewall of the chamber 1 are a loading/unloading port 42 for loading and unloading the wafer W between a wafer transfer chamber (not shown) disposed near the chamber 1 and a gate valve 43 for opening and closing the loading/unloading port 42. Moreover, a heater 48 is embedded in the wall portion of the chamber 1, and is connected to a heater power supply 49. By supplying power from the heater power supply 49 to the heater 48, the wall portion of the chamber 1 is heated to a desired temperature, e.g., about 150 to 250° C.

The respective components of the Ti film formation apparatus 100 are connected to and controlled by a control unit 60 configured with a computer. Further, the control unit 60 is connected to a user interface 61 including a keyboard and a display, wherein the keyboard is used for a process manager to input commands for managing the Ti film formation apparatus 100, and the display is used for showing visualized images of the operational status of the Ti film formation apparatus 100. Further, the control unit 60 is connected to a storage unit 62 that stores control programs for implementing various processes performed in the film formation apparatus 100 under the control of the control unit 60, or information such as programs, i.e., recipes, for the respective components of the Ti film formation apparatus 100 to perform processes in accordance with process conditions. The recipes may be stored in a hard disk or semiconductor memory, or stored in a portable storage medium, such as a CDROM or DVD, to be set to a predetermined position of the storage unit 62. Further, the recipes may be transmitted from another apparatus through, e.g., a dedicated line, as needed. Moreover, a required recipe is retrieved from the storage unit 62 and executed by the control unit 60 in accordance with an instruction or the like from the user interface 61. Consequently, the Ti film formation apparatus 100 can perform a predetermined process under the control of the control unit 60. Besides, the control unit 60 sends instructions to the heater power supplies 6, 46 and 49 based on a signal of thermocouples (not shown), and performs the temperature control of the susceptor 2 by the heater 5, that of the shower head 10 by the heater 45, and that of the wall portion of the chamber 1 by the heater 48 independently.

Hereinafter, the film formation method of the present embodiment in the above film formation apparatus 100 will be described.

Figure 2:
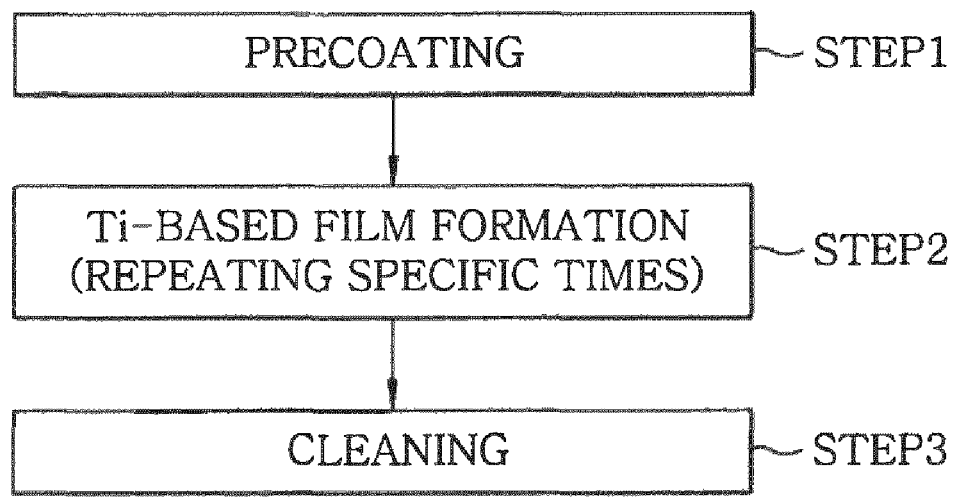
FIG. 2 is a flowchart illustrating the Ti-based film forming method in accordance with the embodiment of the present invention.

As illustrated in FIG. 2, the film formation method of the present embodiment includes a precoating process (step 1), a film forming process (step 2) and a cleaning process (step 3), and these processes are carried out sequentially. In each of the steps, a Ti film formation and a TiN film formation will be described as a Ti-based film formation.

First of all, the precoating process of step 1 will be described.

The heater power supplies 6, 46 and 49 are controlled by the control unit 60. The temperatures of the susceptor 2, the shower head 10, and the wall portion of the chamber 1 are independently controlled by the heaters 5, 45 and 48 to levels required in a film forming process to be described later.

In that state, in order to form a TiN film, $N_2$ gas, $NH_3$ gas and $TiCl_4$ gas are introduced at predetermined flow rates into the chamber 1 containing no wafers W via the shower head, and a TiN film is precoated on the inner walls of the chamber 1 and the gas exhaust chamber 36 and the surfaces of the shower head 10 and the susceptor 2 by heating them by the heater 5 and the like.

In order to form a Ti film, Ar gas, $H_2$ gas and $TiCl_4$ gas are introduced at predetermined flow rates into the chamber 1 containing no wafers W via the shower head. These gases are converted into a plasma by applying the high frequency power from the high frequency power supply 34 while heating inner walls of the chamber 1 and the gas exhaust chamber 36 and the surfaces of the shower head 10 and the susceptor 2 by the heater 5 and the like and, thus, a Ti film is formed thereon. Next, the formed Ti film is nitrided by introducing $NH_3$ gas while maintaining the plasma. As a consequence, a TiN film is precoated.

Further, the conditions of the precoating processes are respectively the same as those of the TiN film formation and those of the Ti film formation followed by the nitriding process which will be described below.

Hereinafter, the film forming process of step 2 will be described.

During the film forming process, the inner pressure of the chamber 1 after the precoating is adjusted to that of a transfer chamber (not shown) connected thereto via the gate valve 43. Next, the gate valve 43 opens, and the wafer W is loaded from the wafer transfer chamber into the chamber 1 via the loading/unloading port 42. Then, the film forming process is carried out.

First, a film forming process of a TiN film will be described.

The heater power supplies 6, 46 and 49 are controlled by the control unit 60. The temperatures of the susceptor 2, the shower head 10, and the wall portion of the chamber 1 are independently controlled by the heaters 5, 45 and 48, whereby the susceptor 2, the shower head 10 and the wall portion of the chamber 1 are respectively maintained at predetermined temperatures in a range from about 400 to 700° C., in a range from about 150 to 250° C., and in a range from about 150 to 250° C. In that state, the wafer W is loaded into the chamber 1 as described above. Then, the wafer W is preliminarily heated by supplying $N_2$ gas into the chamber 1.

When the temperature of the wafer becomes substantially stable, $N_2$ gas, $NH_3$ gas and $TiCl_4$ gas are made to flow in a pre-flow line (not shown) at predetermined flow rates, thereby performing pre-flowing. Thereafter, the gas flow is switched to the film formation lines, while maintaining the gas flow rates and the pressure, and these gases are introduced into the chamber 1 via the shower head 1. Moreover, $NH_3$ gas and $TiCl_4$ gas react on the wafer W heated to a predetermined temperature by the heater 5, so that TiN is deposited on the wafer W. After a predetermined period of time elapses, a TiN film of a predetermined thickness is formed on the wafer W.

The desirable ranges of other conditions of the TiN film forming process are as follows.
  i) $TiCl_4$ gas flow rate: 20~200 mL/min(sccm)
  ii) $N_2$ gas flow rate: 50~1000 mL/min(sccm)
  iii) $NH_3$ gas flow rate: 10~500 mL/min(sccm)
  iv) pressure in chamber: 133~1333 Pa (1~10 Torr)

After the TiN film is formed, the supply of $NH_3$ gas and $TiCl_4$ gas is stopped. Further, $N_2$ gas is supplied as a purge gas to purge the interior of the chamber 1. Then, $N_2$ gas and $NH_3$ gas are supplied to perform a nitriding process on a surface of a TiN thin film formed on the wafer W. At this time, the temperatures of the susceptor 2, the shower head 10 and the wall portion of the chamber 1 are set to the levels required in the film forming process. Moreover, it is not necessary to perform the nitriding process.

After a predetermined period of time elapses, the supply of $NH_3$ gad and $TiCl_4$ gas is gradually stopped. When the supply of these gases is completely stopped, the film forming process is completed. Then, the gate valve 43 opens, and the wafer W is extracted from the apparatus by a wafer transfer apparatus (not shown) loaded into the chamber 1.

Hereinafter, a film forming process of a Ti film will be described.

The heater power supplies 6, 46 and 49 are controlled by the control unit 60. The temperatures of the susceptor 2, the shower head 10, and the wall portion of the chamber 1 are independently controlled by the heaters 5, 45 and 48. In a state where the susceptor 2, the shower head 10 and the wall portion of the chamber 1 are respectively maintained at predetermined temperatures in a range from about 400 to 700° C., in a range from about 400 to 500° C., and in a range from about 150 to 250° C., the wafer W is loaded into the chamber 1 as described above. Then, Ar gas, $H_2$ gas and $TiCl_4$ gas are made to flow at predetermined flow rates via a pre-flow line (not shown) to the chamber 1, thereby performing pre-flowing. Thereafter, gas switched to the film formation lines, while maintaining the pressure and the gas flow rates, and these gases are introduced into the chamber 1 via the shower head 1. At this time, the high frequency power is applied from the high frequency power supply 34 to the shower head 10, so that Ar gas, $H_2$ gas and $TiCl_4$ gas introduced into the chamber 1 are turned into a plasma. Moreover, the gases turned into the plasma react on the wafer W heated to a predetermined temperature by the heater 5 and, thus, Ti is deposited on the wafer W. After a predetermined period of time elapses, a Ti film of a predetermined thickness is formed.

The desirable ranges of other conditions of the Ti film forming process are as follows.
  i) high frequency power from the high frequency power supply 34
    frequency: 300 kHz~27 MHz
    power: 100~1500 W
  ii) $TiCl_4$ gas flow rate: 1~20 mL/min(sccm)
  iii) Ar gas flow rate: 500~2000 mL/min(sccm)
  iv) $H_2$ gas flow rate: 1000~5000 mL/min(sccm)
  v) pressure in chamber: 133~1333 Pa (1~10 Torr)

After the Ti film is formed, the supply of $H_2$ gas and $TiCl_4$ gas is stopped. Further, Ar gas or $N_2$ gas is supplied as a purge gas to purge the interior of the chamber 1. Then, $N_2$ gas and $NH_3$ gas are supplied, and these gases are turned into a plasma by applying the high frequency power from the high frequency power supply 34. As a consequence, a nitriding process is performed on a surface of a Ti thin film formed on the wafer W. At this time, the temperatures of the susceptor 2, the shower head 10 and the wall portion of the chamber 1 are set to the levels required in the film forming process. However, the above-described nitriding process may be omitted.

Hereinafter, the cleaning process of step 3 will be described.

The cleaning process is carried out after the above film forming process is performed on a predetermined number of wafers. The cleaning process may be performed regularly or when necessary.

In this process, $Cl_2$ gas as a cleaning gas is introduced into the chamber 1 containing no wafers, and a dry cleaning is basically performed without a plasma. However, $Cl_2$ gas may be turned into a plasma by auxiliarily using the remote plasma sources 51 and 52. The $Cl_2$ gas is highly reactive with a Ti-based material, e.g., Ti, TiN, $TiSi_2$, $TiO_2$ or the like, formed or adhered to the susceptor 2 and the shower head 10 in the chamber 1 and the wall portion of the chamber 1 during the Ti-based film formation. Thus, it is suitable as a cleaning gas used after the Ti-based film formation.

The cleaning process needs to be performed at a temperature at which corrosion resistance of a material of a cleaning target portion can be maintained by using a proper cleaning gas thereto. The conventionally used $ClF_3$ gas is extremely easily decomposed even at a low temperature (room temperature), and is characterized by its ability to clean the entire interior of the chamber regardless of the temperature of each component in the chamber. The characteristic in which it is easily decomposed at a low temperature indicates that the corrosion of the cleaning target portion occurs even at a low temperature. For that reason, every unit in the chamber needs to be maintained at a low temperature not exceeding about 300° C., e.g., about 200° C., during the cleaning process.

On the other hand, the $Cl_2$ gas used in the present embodiment has a higher decomposition temperature than that of the $ClF_3$ gas, which is higher than or equal to about 250° C. Therefore, by controlling the temperature of each unit in the chamber, a portion where cleaning is performed and a portion where cleaning is not performed can be formed. That is, the cleaning can be selectively carried out.

Figure 3:
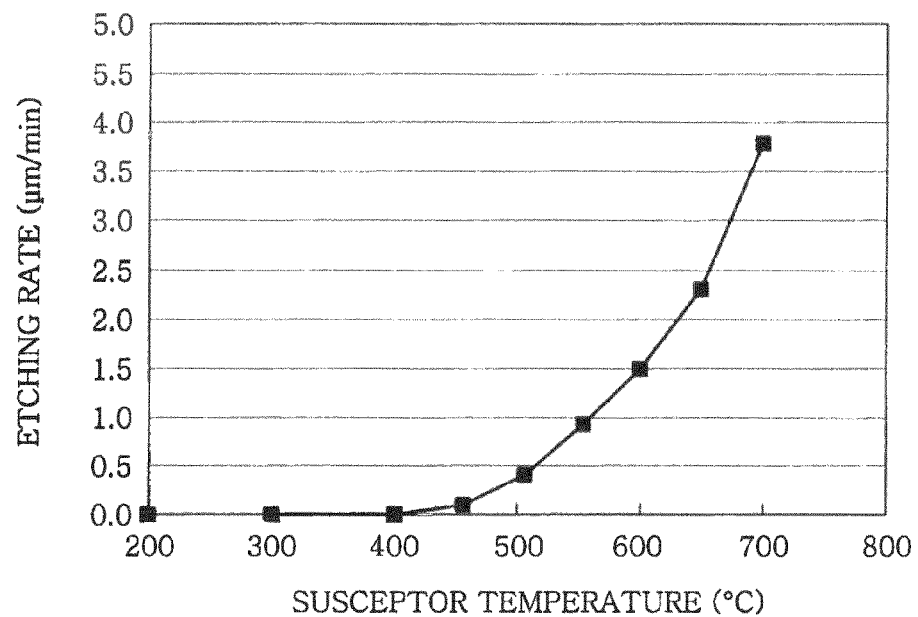
FIG. 3 provides a graph depicting a relationship between a temperature of a susceptor and an etching rate of a TiN film by $Cl_2$ gas.

FIG. 3 shows cleaning characteristics of $Cl_2$ gas. This drawing describes a relationship between a temperature of a susceptor and an etching rate of a TiN film deposited on the susceptor by $Cl_2$ gas. At this time, a pressure in a chamber was controlled at about 133 Pa; a flow rate of $Cl_2$ gas was about 2000 mL/min(sccm); a flow rate of Ar gas was about 100 mL/min(sccm); and a flow rate of $N_2$ gas was about 100 mL/min(sccm). As illustrated in this drawing, the etching of the TiN film starts at a temperature of about 400° C., and the etching rate increases sharply as the temperature increases. That is, in these conditions, the decomposition start temperature of $Cl_2$ gas is about 400° C., and the etching reaction process is believed to be in a reaction rate controlled regime between Cl atoms generated by the decomposition of $Cl_2$ gas and the TiN film. Therefore, it is found that the cleaning can be performed at the heating temperature of the susceptor 2 in a range from about 400 to 700° C. Especially, when the temperature is in a range from about 550 to 700° C., a high etching rate and good cleaning properties are obtained. This tendency is also shown in a Ti film.

Figure 4:
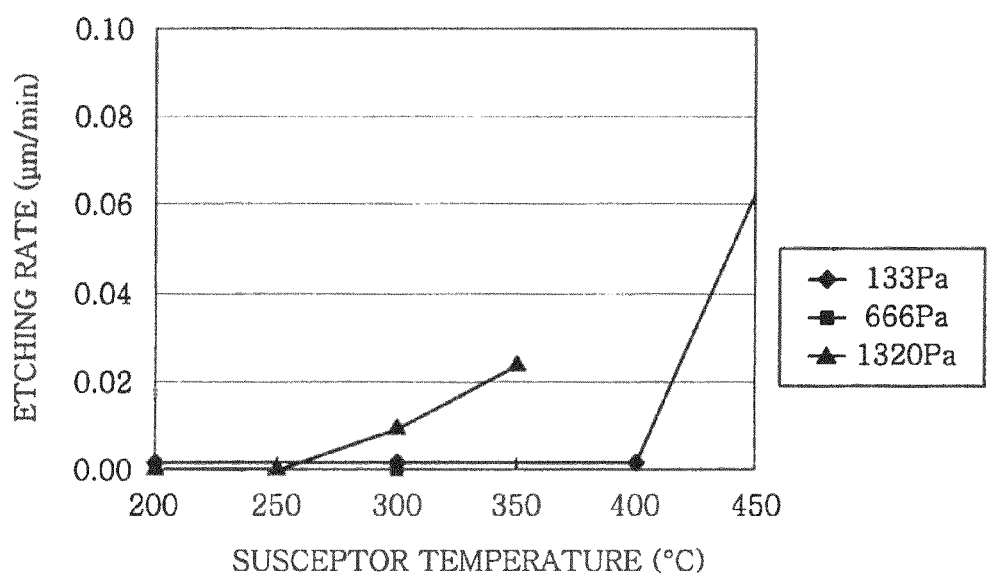
FIG. 4 presents a graph showing a relationship between a temperature of a susceptor and an etching rate of a TiN film by $Cl_2$ gas in the case of changing a pressure in a chamber.

The cleaning characteristics of $Cl_2$ gas change depending on the pressure. This will be explained with reference to FIG. 4. FIG. 4 is a graph depicting a relationship between a temperature of a susceptor and an etching rate of a TiN film deposited on the susceptor by $Cl_2$ gas in the case of setting the pressure in the chamber to 133 Pa, 666 Pa and 1320 Pa. As can be seen from this drawing, etching species increase at a low temperature by increasing a pressure in the chamber, and the etching starts at a temperature slightly above about 250° C. That is, when the pressure increase from about 133 Pa to about 1320 Pa, the decomposition start temperature of $Cl_2$ gas decreases to about 250° C., and the cleaning can be performed at a temperature higher than or equal to about 250° C. From the above, it is found that the decomposition start temperature of $Cl_2$ gas can be controlled by controlling the pressure in the chamber. Accordingly, the pressure in the chamber can be controlled so that the decomposition start temperature of $Cl_2$ gas becomes a predetermined temperature depending on a temperature of a cleaning target portion. To be specific, when a portion having a temperature of about 350° C. needs to be cleaned, the temperature of about 350° C. is lower than the decomposition start temperature of $Cl_2$ gas under the condition that the pressure in the chamber is about 133 Pa, so that the cleaning is not performed. However, if the pressure is increased to about 1320 Pa, the temperature becomes higher than the decomposition start temperature and, thus, the cleaning can be carried out.

Figure 5:
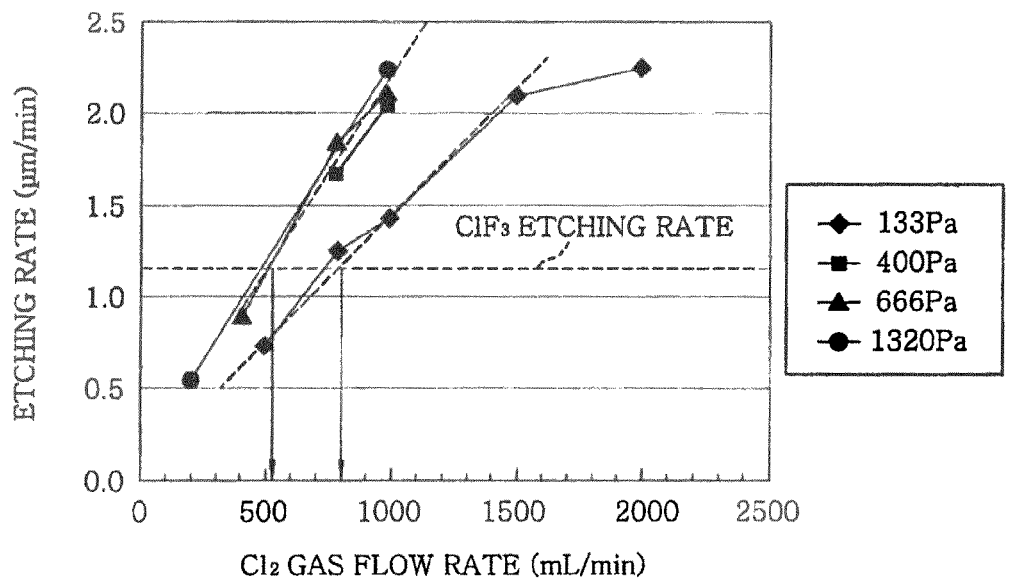
FIG. 5 offers a graph describing a relationship between a flow rate of $Cl_2$ gas and an etching rate of a TiN film in the case of changing a pressure in a chamber.

FIG. 5 offers a graph describing a relationship between a flow rate of $Cl_2$ gas and an etching rate of a TiN film in the case of changing a pressure in a chamber and setting a temperature of a susceptor to about 650° C. When the flow rate of $Cl_2$ gas is smaller than or equal to about 1500 mL/min(sccm) under the condition that the pressure in the chamber is about 133 Pa, the etching rate of the TiN film increases in proportion to the $Cl_2$ gas flow rate, which corresponds to a rate of arrival controlled regime. However, when the flow rate of $Cl_2$ gas is greater than about 1500 mL/min(sccm), the etching rate of the TiN film is saturated, and it is shifted to a reaction rate controlled regime where the etching rate of the TiN film only depends on a temperature.

When the flow rate of $Cl_2$ gas is smaller than or equal to about 1000 mL/min(sccm) under the condition that the pressure is higher than about 133 Pa, the etching rate of the TiN film increases in proportion to the $Cl_2$ gas flow rate, which corresponds to the rate of arrival controlled regime. In the above pressure condition, the data of the case where a flow rate is larger than about 1000 mL/min(sccm) is not given. However, it can be estimated that the reaction rate controlled regime occurs when the etching rate of the TiN film is saturated at a flow rate higher than a certain flow rate, as in the case where the pressure is about 133 Pa.

As set forth above, in the cleaning process using $ClF_3$ gas, the susceptor temperature is about 200° C., and the etching rate of the TiN film at this temperature is about 1.2 µm/min. In order to obtain the same etching rate, the flow rate of $Cl_2$ gas needs to be more than about 800 mL/min(sccm) at the pressure of about 133 Pa, and more than about 500 mL/min(sccm) at other conditions. With this flow rate, the cleaning time is not lengthened compared to that in the conventional case.

In the rate of arrival controlled regime, the cleaning can be effectively performed due to the reaction between the TiN film and the etching species (Cl atoms) generated by thermal decomposition of the $Cl_2$ gas. However, it is difficult to remove deposits or a film formed on, e.g., a backside of the susceptor to which the etching species may not be readily supplied. When the cleaning is performed in the reaction rate controlled regime, the amount of etching species is excessive in the chamber. Therefore, the etching species reach the entire interior of the chamber, completely cleaning the deposits. That is, the rate of arrival controlled regime and the reaction rate controlled regime can be selected depending on the status of deposits in the chamber after the film forming process. Further, the cleaning can also be performed in two steps including an initial step for performing cleaning under the conditions of the rate of arrival controlled regime and a next step for removing deposits that have not removed in the initial step under the conditions of the reaction rate controlled regime.

Figure 6:
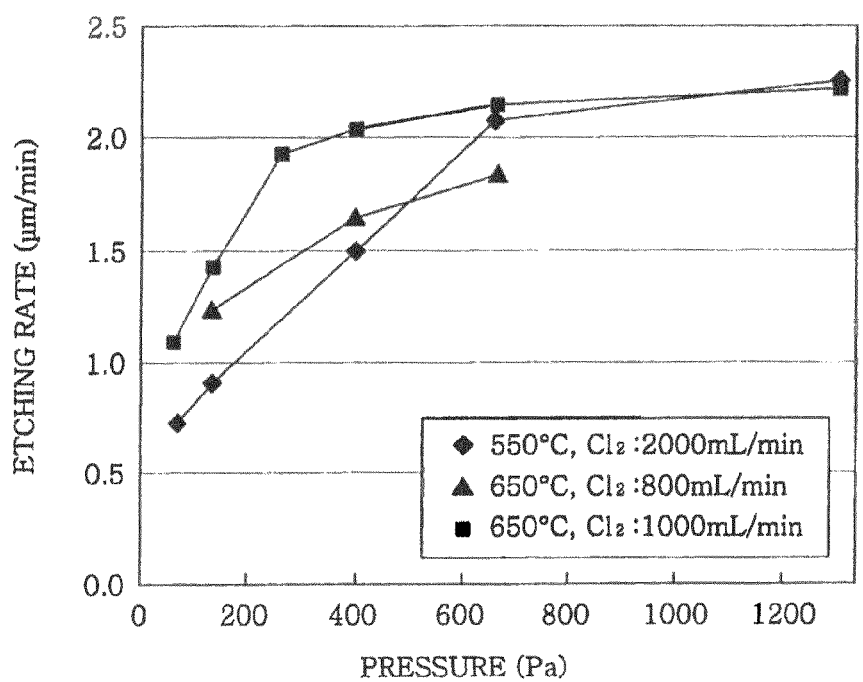
FIG. 6 represents a graph illustrating a relationship between a pressure in a chamber and an etching rate of a TiN film by $Cl_2$ gas in the case of changing a temperature of a susceptor and a flow rate of the $Cl_2$ gas.

The following is a description of a relationship between a pressure in a chamber and an etching rate of a TiN film by $Cl_2$ gas in cases of changing a temperature of a susceptor and a $Cl_2$ gas flow rate. FIG. 6 is a graph showing a relationship between a pressure in a chamber and an etching rate of a TiN film by $Cl_2$ gas in the cases in which a temperature and a $Cl_2$ gas flow rate are set to 550° C. and 2000 mL/min(sccm), 650° C. and 800 mL/min(sccm), and 650° C. and 1000 mL/min (sccm). This drawing shows that the etching rate of the TiN film is saturated at a certain pressure in each of the conditions. Further, the saturation tends to occur at a lower pressure as the temperature of the susceptor increases and as the flow rate of the $Cl_2$ gas increases. In view of cleaning stability, it is preferable to perform the cleaning at a pressure at which etching saturation takes place. In view of corrosion prevention, however it is preferable to perform the cleaning at a lower possible pressure at which the etching rate is almost saturated. Further, since a pressure at which etching rate is saturated changes depending on the susceptor temperature and the flow rate of the $Cl_2$ gas, it is preferable to control the pressure in the chamber depending on the temperature and the flow rate of the $Cl_2$ gas during the cleaning process.

As described above, $Cl_2$ gas is advantageous in that the selective cleaning can be performed, but does not provide the same effects of $ClF_3$ gas capable of cleaning the entire interior of the chamber because its decomposition temperature is higher than that of $ClF_3$ gas. For that reason, when $Cl_2$ gas is used as a cleaning gas, it is important to set a temperature of a portion other than the possibly cleaning target portion to a level at which film formation or adhesion of by-products can be prevented to the utmost during the film formation.

The upper limit temperature of the cleaning process depends on a material of a target portion as well as a decomposition difficulty of a cleaning. The cleaning has a purpose of etching the Ti-based film formed on the target portion, so that etching species (atoms after gas decomposition) of an amount capable of obtaining a sufficient etching rate are required. When $Cl_2$ gas is used as a cleaning gas, in order to obtain the etching species having the amount capable of ensuring the sufficient etching rate, the temperature of the cleaning target portion needs to be higher compared to the case where $ClF_3$ gas is used as a cleaning gas. Although the etching rate increases as the temperature increases, the upper limit temperature of the cleaning target portion is determined by the corrosion resistance of the material thereof.

To be strict, the corrosion resistance of the material also depends on the vapor pressure of reaction products generated by the reaction between the cleaning gas and the material of the target portion. When the material of the target portion is, e.g., AlN, if $ClF_3$ gas is used as a cleaning gas, $AlF_x$ (x being 1 to 3) that is stable and has a low vapor pressure is formed by reaction between AlN and F atoms. Accordingly, the surface of the target portion is protected, and the corrosion does not occur. However, AlN is a ceramic material which is not ideally uniform. Further, since it is formed by being hardened by sintering AlN powder, $AlF_x$ is not uniformly formed in reality, and a part thereof becomes powders, resulting in particles. On the other hand, if $Cl_2$ gas is used as a cleaning gas, unstable $AlCl_x$ being 1 to 3) is formed on the AlN surface by the reaction with Cl.

However, $AlCl_x$ has a high vapor pressure and thus is vaporized without becoming particles. For that reason, it is preferable to use $Cl_2$ gas as a cleaning gas for an in-chamber member made of AlN ceramics. This is verified from the fact that the components of particles are always $AlF_x$, and $AlCl_x$ expected to be generated by the reaction between AlN and $TiCl_4$ gas or between AlN and HCl at a high-temperature film formation is not detected as a particle component, HCl being generated by the reaction between $TiCl_4$ gas and a reducing agent such as $H_2$, $NH_3$ or the like.

In other words, when $Cl_2$ gas is used as a cleaning gas, the reaction of producing $AlCl_x$ takes place, as in the film forming process using $TiCl_4$ gas and a reducing agent such as $H_2$, $NH_3$ or the like. Therefore, the target portion capable of enduring the high temperature film forming process can also ensure the cleaning using $Cl_2$ gas at the same temperature. From the above, it is found that the cleaning using $Cl_2$ gas can be performed at the substantially same temperature as the film forming temperature. Moreover, the material of the target portion is not limited to AlN and may be one that does not generate particles due to corrosion during a film forming process. In that case as well, the cleaning using $Cl_2$ gas can be carried out at the substantially same temperature same as the film forming temperature. For example, when the material of the target portion is Ni or Ni alloy, $NiCl_2$ having a high vapor pressure is generated and vaporized without non-uniformly leaving on a surface a protective film such as $NiF_2$. As a result, the surface can be maintained in a clean state.

Even when the material of the target portion is Al compound such as alumina, stainless steel or the like other than conventionally used AlN, carbon, $Si_3N_4$, SiC or the like, without being limited to AlN, Ni, or Ni alloy, the cleaning can be performed at a temperature substantially same as a film forming temperature by using $Cl_2$ gas as a cleaning gas. On the other hand, conventionally used $ClF_3$ gas may inflict damages due to the reaction with the above constituent materials at the film forming temperature, so that it is not preferable to perform the cleaning at the film forming temperature.

This will be described based on a test result.

Here, a test piece made of AlN as a material forming a susceptor was exposed to a cleaning gas while supplying as the cleaning gas $Cl_2$ gas or $ClF_3$ gas into a chamber, and corrosion resistance thereof was examined. At this time, in a case of using $ClF_3$ gas, the flow rates of $ClF_3$ gas and $N_2$ gas were respectively set to about 10 mL/min(sccm), 1000 mL/min(sccm), and in a case of using $Cl_2$ gas, the flow rates of $Cl_2$ gas and $N_2$ gas were respectively set to about 100 mL/min(sccm), 1000 mL/min(sccm), so that the etching rate of the TiN film at about 700° C. could be substantially the same in both cases. Further, a pressure in the chamber was controlled at about 133 Pa, and was maintained for about 60 minutes at about 700° C. and 500° C., to thereby monitor the weight change thereof. As for the AlN test piece, there was used one having a dimension of 15 nm×15 nm×1 nm. As a result, it was found that when it was exposed to $Cl_2$ gas, no weight change was monitored both at about 550° C. and about 700° C. On the other hand, when it was exposed to $ClF_3$ gas, the weight was slightly reduced by about 0.0003 g at about 550° C., but greatly reduced by about 0.0122 g at about 700° C.

Figure 7:
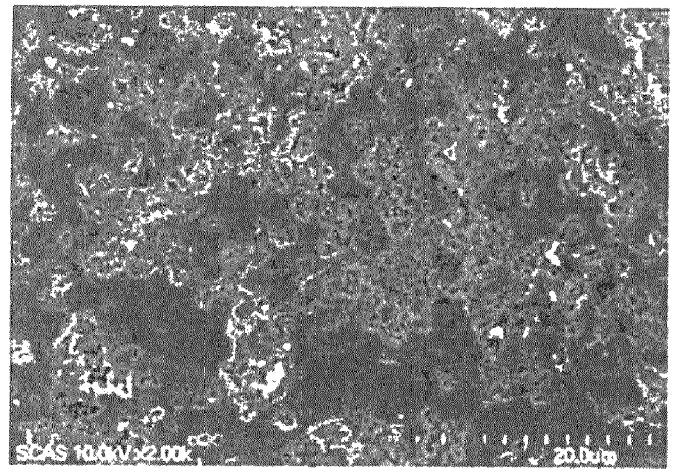
FIG. 7 depicts a scanning electron microscope (SEM) picture, enlarged 2000 times, of a surface of an AlN test piece which is taken before a cleaning gas exposure.
Figure 8:
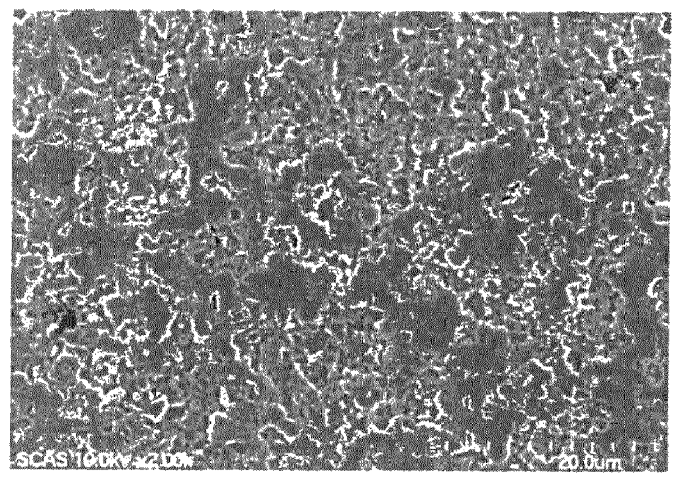
FIG. 8 describes a scanning electron microscope (SEM) picture, enlarged 2000 times, of the surface of the AlN test piece which is taken after the exposure at about 700° C. to $Cl_2$ gas.
Figure 9:
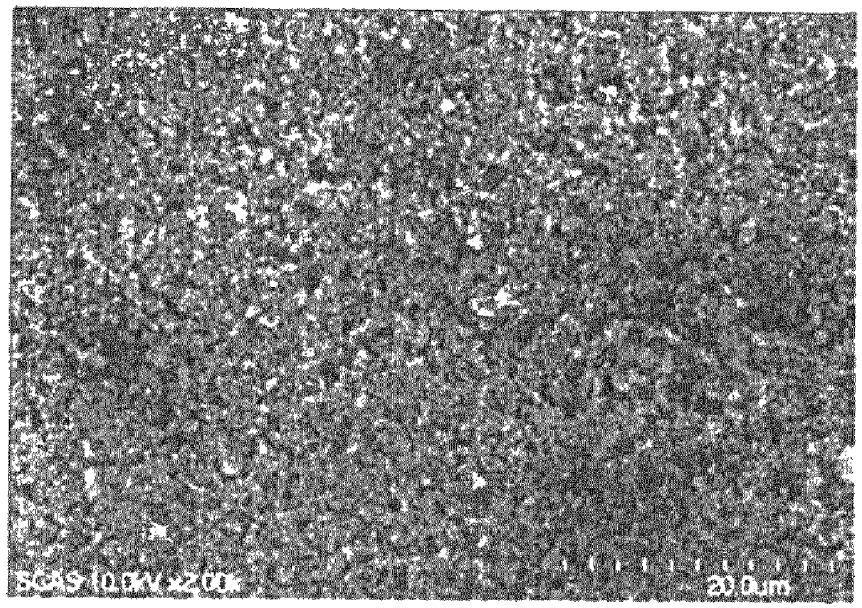
FIG. 9 is a scanning electron microscope (SEM) picture, enlarged 2000 times, of the surface the an AlN test piece which is taken after the exposure at about 700° C. to $ClF_3$ gas.

FIGS. 7 to 9 depict scanning electron microscope (SEM) pictures, enlarged 2000 times, of the surface of the AlN test piece. FIG. 7 shows one taken before exposure to a cleaning gas; FIG. 8 illustrates one taken after exposure to $Cl_2$ gas at about 700° C.; and FIG. 9 depicts one taken after exposure to $ClF_3$ gas at about 700° C. As can be seen from these SEM pictures, when $Cl_2$ gas was used, the surface of the AlN test piece after the exposure at about 700° C. was substantially the same as that taken before the exposure. On the other hand, when $ClF_3$ gas was used, the surface thereof was severely changed after the exposure.

From the above results, it was found that AlN as a material forming a susceptor was hardly corroded by $Cl_2$ gas, but corroded by ClF$_3$ gas, at about 700° C. close to the upper limit of the film forming temperature.

The ClF$_3$ gas conventionally used as a cleaning gas may inflict damages due to reaction with constituent materials of in-chamber members in the film forming temperature. For that reason, there is required the sequence of decreasing the temperature to be lower than or equal to about 300° C., e.g., about 200° C., for the cleaning, and increasing the temperature to the film forming temperature after the completion of the cleaning. Accordingly, the productivity deteriorates. On the other hand, when Cl$_2$ gas is used as a cleaning gas, the decomposition temperature thereof is higher than or equal to about 250° C., and the susceptor 2 as a main cleaning target is not corroded even at a temperature close to the film forming temperature, as set forth above. Thus, the cleaning can be performed while setting the temperature of the susceptor 2 to the film forming temperature or a temperature close thereto and, thus, the temperature increasing time and the temperature decreasing time can be reduced. As a result, the productivity of the film formation apparatus for a Ti-based film can be greatly improved.

Figure 10A:
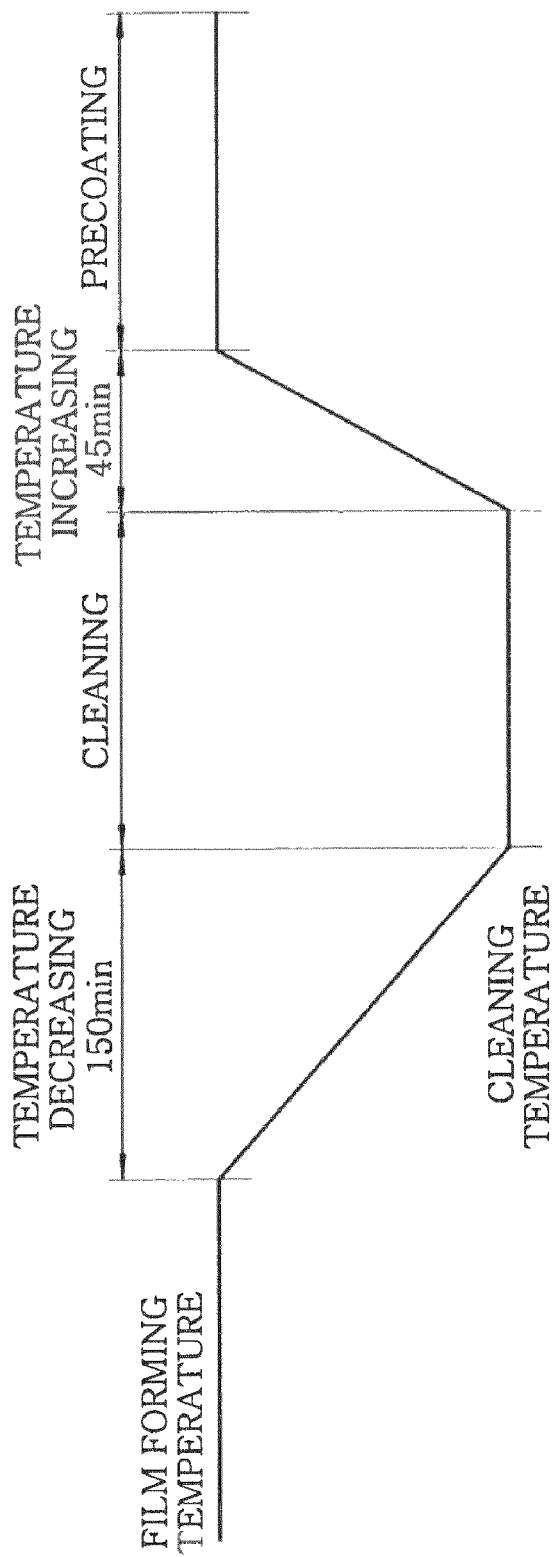
FIG. 10A shows a time table of a cleaning process in the case of using conventionally used $ClF_3$ gas as a cleaning gas.
Figure 10B:
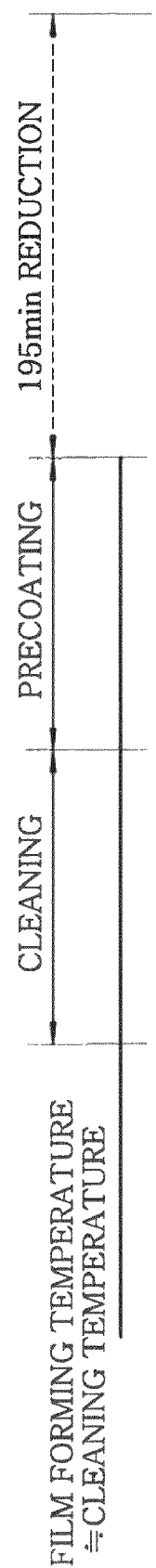
FIG. 10B provides a time table of a cleaning process in the case of using $Cl_2$ gas of the present invention as a cleaning gas.

FIG. 10A shows the time table of the conventional cleaning by using ClF$_3$ gas. To be specific, the temperature decreasing time from the completion of the film formation to the start of the cleaning is about 150 minutes, and a temperature increasing time from the completion of the cleaning to the start of the precoating is about 45 minutes. In total, about 195 minutes are consumed for increasing and decreasing the temperature. When the cleaning is ideally performed at the film forming temperature, the temperature increasing time and the temperature decreasing time are not required and, thus, the downtime of the apparatus can be reduced by more than three hours, as depicted in FIG. 10B. In an actual process, although it is difficult to perform cleaning and film formation at the completely same temperature, the productivity can be improved by shortening the temperature increasing time and the temperature decreasing time compared to those in the conventional case.

The above is the description of the basic conditions of the cleaning process. However, the TiN film and the Ti film are formed under different film forming conditions, and types of deposits formed or adhered on each unit in the chamber 1 and adhesion states thereof are also different. Thus, the cleaning process conditions need to be changed depending on the films.

First of all, the cleaning process after the TiN film formation will be described.

Figure 11:
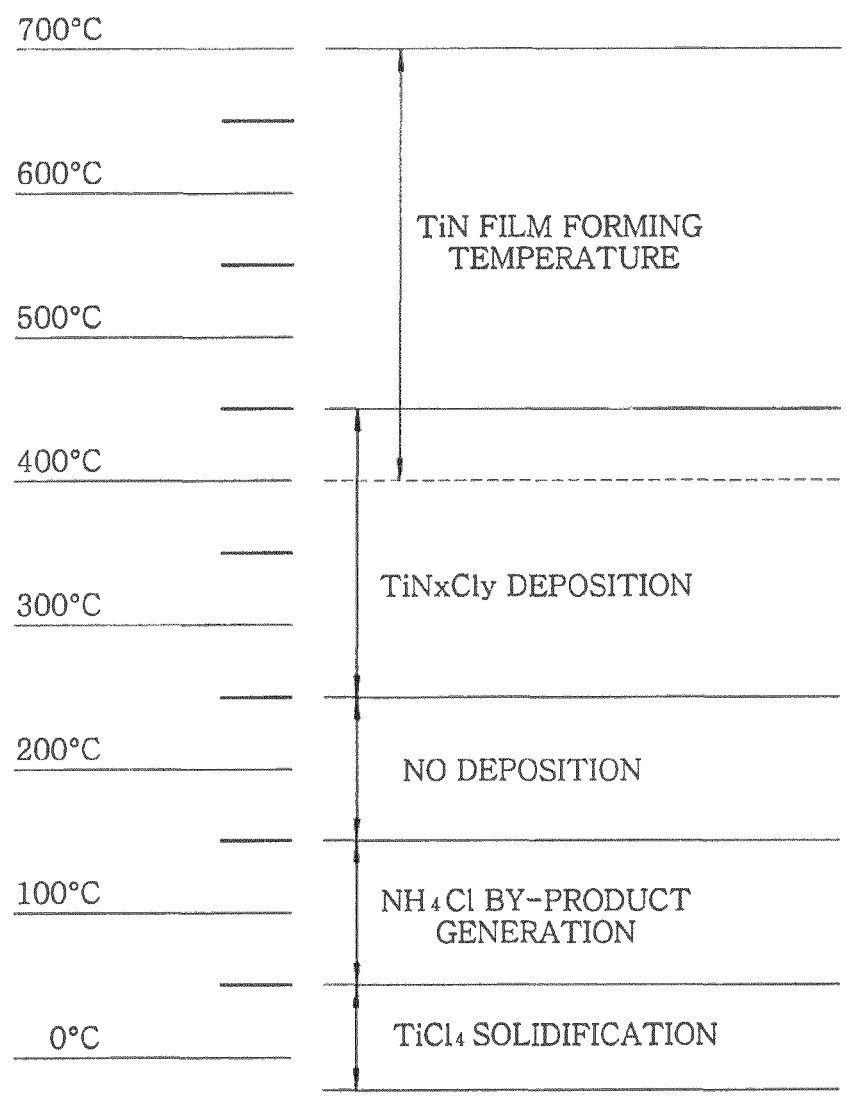
FIG. 11 presents a relationship between types of deposits and a temperature during a TiN film formation.

The TiN film formation is performed by only a thermal reaction, and types of deposits vary depending on temperatures, as illustrated in FIG. 11. In other words, TiCl$_4$ is solidified at the temperature up to about 50° C.; NH$_4$Cl as a by-product produced at a low temperature is adhered at a temperature raging in from about 50 to 150° C.; deposits are not adhered at a temperature raging in from about 150 to 250° C.; and TiN$_x$Cl$_y$ is deposited at a temperature raging in from about 250 to 450° C. Further, a TiN film is formed at a temperature raging in from about 450 to 700° C., which is a temperature at which TiN is generated. Moreover, a TiN film can also be formed at a temperature raging in from about 400 to 450° C. depending on the conditions.

The TiN film is formed while maintaining the temperatures of the susceptor 2 at a temperature raging in from about 400 to 700° C., the shower head 10 and the wall portion of the chamber 1 at a temperature raging in from about 150 to 250° C., as described above. Referring to FIG. 11, the temperature setting prevents the deposits from adhering to the shower head 10 and the wall portion of the chamber 1, and allows TiN$_x$Cl$_y$ or TiN to be adhered only to the susceptor 2.

Therefore, in the cleaning process after the TiN film formation, the temperature of the susceptor 2 is heated to a level substantially same as the temperature thereof during the film formation. At this time, deposits are hardly deposited to the shower head 10 and the wall portion of the chamber 1, so that the cleaning is performed without damaging constituent materials at a temperature raging in from about 150 to 250° C. which is lower than a decomposition temperature of Cl$_2$, as in the film formation. For that reason, as for the material of the shower head 10 or the wall portion of the chamber 1, there may be used an Al-based material to confer sufficient corrosion resistance, as described above, and a high corrosion resistance material only needs to be used for the susceptor 2. In the present embodiment, the susceptor 2 is made of an AlN material and has sufficient corrosion resistance. In addition, it is also possible to use Ni, Ni alloy, stainless steel, Si$_3$N$_4$, SiC and the like instead of AlN. The temperatures of the shower head 10 and the wall portion of the chamber 1 during the cleaning may be the same as those during the film formation or close thereto within the above range.

Hereinafter, the cleaning process after the Ti film formation will be described.

The Ti film formation uses a plasma, so that Ti or undecomposed TiCl$_4$ is adhered to a plasma region regardless of a temperature. Especially, it is adhered in large quantity to the shower head directly above the wafer. Accordingly, the generation of deposits cannot be prevented by decreasing the temperature of the shower head 10, unlike in the TiN film formation. Further, when the temperature of the shower head 10 is lower than about 400° C., the adhered film is easily peeled off. Thus, the temperature of the shower head 10 is set to be higher than or equal to about 400° C. during the film formation. Upon completion of the film formation, a nitriding process is performed at a temperature higher than a set temperature of the shower head, so that Ti or undecomposed TiCl$_4$ is turned into a TiN film.

Therefore, during the cleaning, the temperature of the shower head 10 as well as that of the susceptor 2 needs to be higher than or equal to the decomposition temperature of Cl$_2$ gas and, thus, the shower head 10 is set to a temperature close to that (in a range from about 400 to 500° C.) of the shower head 10 during the film formation. Accordingly, the shower head 10 needs to be made of a material capable of enduring high-temperature Cl$_2$ gas. Ni or Ni alloy used in the present embodiment can sufficiently endure high-temperature Cl$_2$ gas. Besides, Si$_3$N$_4$, SiC, C and the like may be used. When the temperature of the shower head 10 needs to be lowered further, it is effective to decrease the decomposition start temperature of Cl$_2$ gas by increasing the pressure in the chamber as described above.

In the Ti film forming process using a plasma, undecomposed TiCl$_4$ as a by-product is adhered to a low-temperature portion such as the wall portion of the chamber 1 and the like, as described above. Accordingly, it is considered to set the temperature of the wall portion of the chamber 1 to be higher than the decomposition temperature of Cl$_2$ gas. In this case, the temperature of the wall portion of the chamber 1 should be increased, which requires temperature increasing time and temperature decreasing time thereafter. However, Cl$_2$ gas is decomposed at a temperature higher than or equal to about 250° C., so that a temperature change is not drastic, and a time extension is also not drastic.

However, an Al-based material as a conventional chamber material may be corroded at a temperature higher than the decomposition temperature of Cl$_2$ gas. For that reason, it is considered to form the chamber 1 by a heat resistant material such as Ni, Ni alloy or the like. However, it is unrealistic to use those materials due to its high price. Moreover, although it is considered to coat the heat resistance material on the inner wall of the chamber 1 by plating or the like, this may lead to peeling off thereof or the like due to a thermal expansion difference. Therefore, there is required a method for performing cleaning by decomposing $Cl_2$ gas without increasing its temperature above the decomposition temperature during the film formation (reduction of selectivity).

As for the method, there is suggested converting $Cl_2$ gas into a plasma. In the present embodiment, $Cl_2$ gas is converted into a plasma by using the remote plasma sources 51 and 52. Accordingly, the cleaning can be carried out at a temperature ranging from about 150 to 250° C. which corresponds to the temperature of the wall portion of the chamber 1 during the film formation. The efficiency of the decomposition by the plasma increases by one order. Therefore, in order to obtain the efficiency of the same level as that of the thermal decomposition, the plasma needs to be generated by setting the conditions and the power at which the decomposition efficiency is lower than or equal to about 10%.

In addition to the plasma assistance, the decomposition of $Cl_2$ gas can be assisted by adding a reducing agent to the $Cl_2$ gas. By adding a reducing agent such as $H_2$, $NH_3$ or the like to $Cl_2$ as a strong oxidizing agent, the decomposition of $Cl_2$ gas can be facilitated.

When the selective prevention of deposition by temperature control is insufficient as in the Ti film forming process by plasma CVD, a decomposition rate of $Cl_2$ gas can be increased by assisting the decomposition of the $Cl_2$ gas by converting it into a plasma or adding a reducing agent thereto. As a consequence, a low-temperature portion in the chamber can be cleaned, and more complete cleaning can be performed. That is, the entire interior of the chamber can be effectively cleaned by improving selectivity in the cleaning by assisting the decomposition of $Cl_2$ gas other than by controlling the temperature.

In this case, by properly adjusting a temperature setting in the chamber, a power of a plasma to be applied or a flow rate of a reducing agent to be added, the decomposition of $Cl_2$ gas in each portion can be controlled with high accuracy and, also, the cleaning selectivity in the chamber can be controlled. Besides, the cleaning with less damages can be carried out.

In order to assist the decomposition properly, the power of the plasma is preferably in a range from about 100 to 300 W. Although the amount of reducing agent depends on the types of the reducing agent, it is preferably in a range from about 10 to 50% of the cleaning gas.

Furthermore, the decomposition assistance of $Cl_2$ gas is particularly suitable for Ti film formation by plasma CVD, but can also be applied to TiN film formation by thermal CVD.

In order to achieve more complete cleaning, it is preferable to add a small amount of $ClF_3$ gas to $Cl_2$ gas. The cleaning target portion is maintained at a high temperature and thus can be sufficiently performed by the $Cl_2$ gas. However, when deposits are not prevented from being attached on a portion other than the cleaning target portion (non-cleaning target portions) and thus are remained thereon, the cleaning may be finished imperfectly.

For example, discolored deposits may remain on the chamber wall after the cleaning by using $Cl_2$ gas. In this case, by auxiliarily adding a small amount of $ClF_3$ gas that is decomposed at a low temperature, the deposits remaining on the non-cleaning target portion can be sufficiently removed by cleaning. In this case, the $ClF_3$ gas is auxiliarily added in small quantity without being used as a main cleaning gas as in the conventional case. Therefore, the amount of etching species (F atoms) generated by the high-temperature decomposition is small, and the high-temperature corrosion is suppressed, thereby reducing damages in the chamber. In view of preventing damages in the chamber, the amount of $ClF_3$ gas to be added is preferably smaller than or equal to about 5% of the cleaning gas.

Moreover, the deposits adhered to the non-cleaning target portion can be sufficiently removed by performing the auxiliary cleaning using $ClF_3$ gas after the cleaning using $Cl_2$ gas. In this case as well, it is preferable to reduce the flow rate of the $ClF_3$ gas to prevent the corrosion by the $ClF_3$ gas.

As set forth above, by using $Cl_2$ gas as a cleaning gas, the cleaning can be performed at a higher temperature compared to the case of using $ClF_3$ gas. In addition, the cleaning can be performed at a temperature near the film forming temperature. Therefore, the deterioration of the productivity can be reduced, and the cleaning target portion can be reliably cleaned without damaging the chamber wall and the like.

The following is a description of a result of a test for examining effects of cleaning by using $Cl_2$ gas to film formation.

Figure 12:
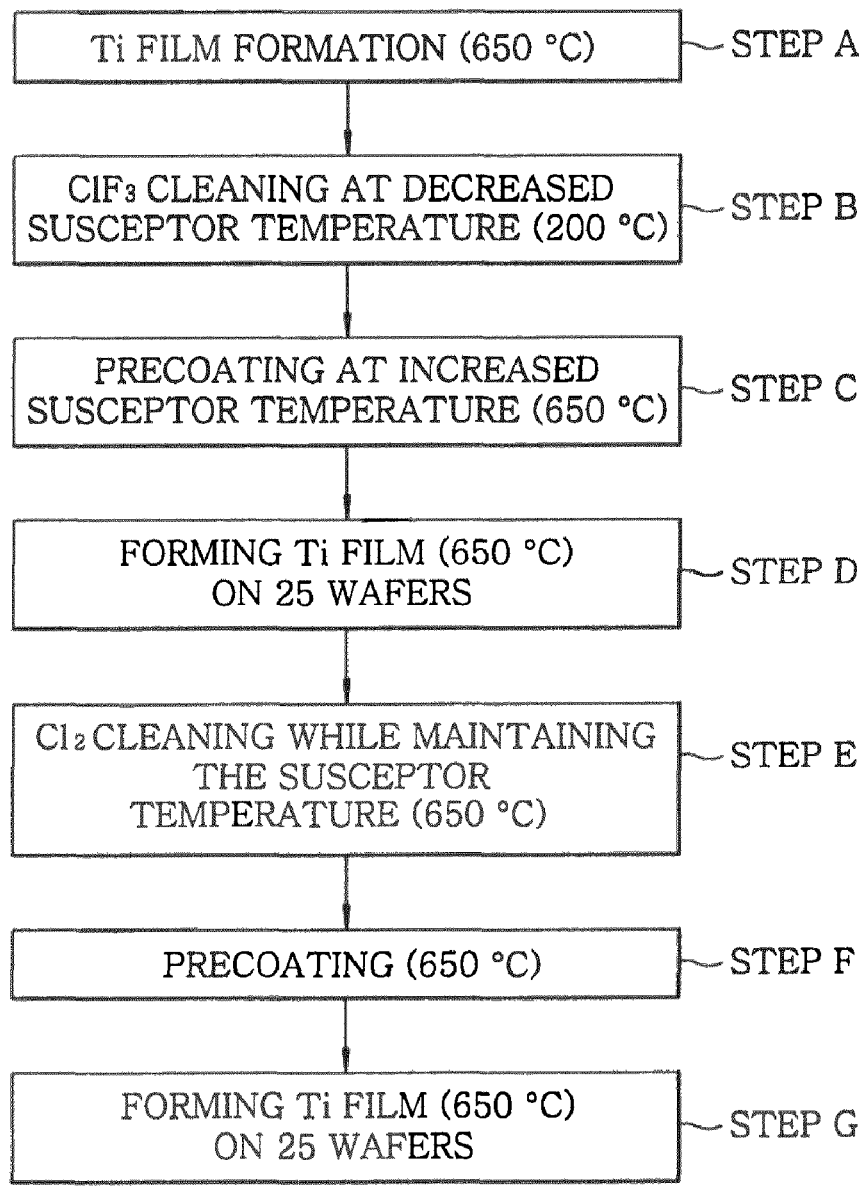
FIG. 12 represents a flowchart explaining a sequence of a test for examining the effect of the cleaning using $Cl_2$ gas of the present invention to the film formation.

Here, as illustrated in FIG. 12, a Ti film forming process was performed at a susceptor temperature of about 650° C. (step A) and, then, a cleaning process using $ClF_3$ gas was performed by decreasing the susceptor temperature from the Ti film forming temperature to about 200° C. (step B). Thereafter, a precoating was performed in the chamber by increasing the susceptor temperature to about 650° C. (step C). Next, a Ti film was formed on 25 wafers consecutively while maintaining the susceptor temperature at about 650° C. (step D) and, then, a cleaning process using $Cl_2$ gas was performed while maintaining the susceptor temperature at 650° C. (step E). Thereafter, a precoating was carried out in the chamber while maintaining the susceptor temperature to about 650° C. (step F). Next, a Ti film was formed on 25 wafers consecutively while maintaining the susceptor temperature to about 650° C. (step G). The Ti film formation in the steps D and G were performed both on Si and $SiO_2$.

Further, the $Cl_2$ gas cleaning in the step E was performed under the conditions capable of obtaining the etching rate same as that of the Ti-based film in the $ClF_3$ gas cleaning of the step B. To be specific, the following conditions were applied in the step E.

pressure: 133 Pa
$Cl_2$ gas flow rate: 800 mL/min(sccm)
Ar gas flow rate: 700 mL/min(sccm)
$N_2$ gas flow rate: 700 mL/min(sccm)

Furthermore, cleaning time was set to a period of time long enough to completely remove a Ti film deposited on surfaces of a guide ring and a susceptor in the Ti film forming process.

Figure 13:
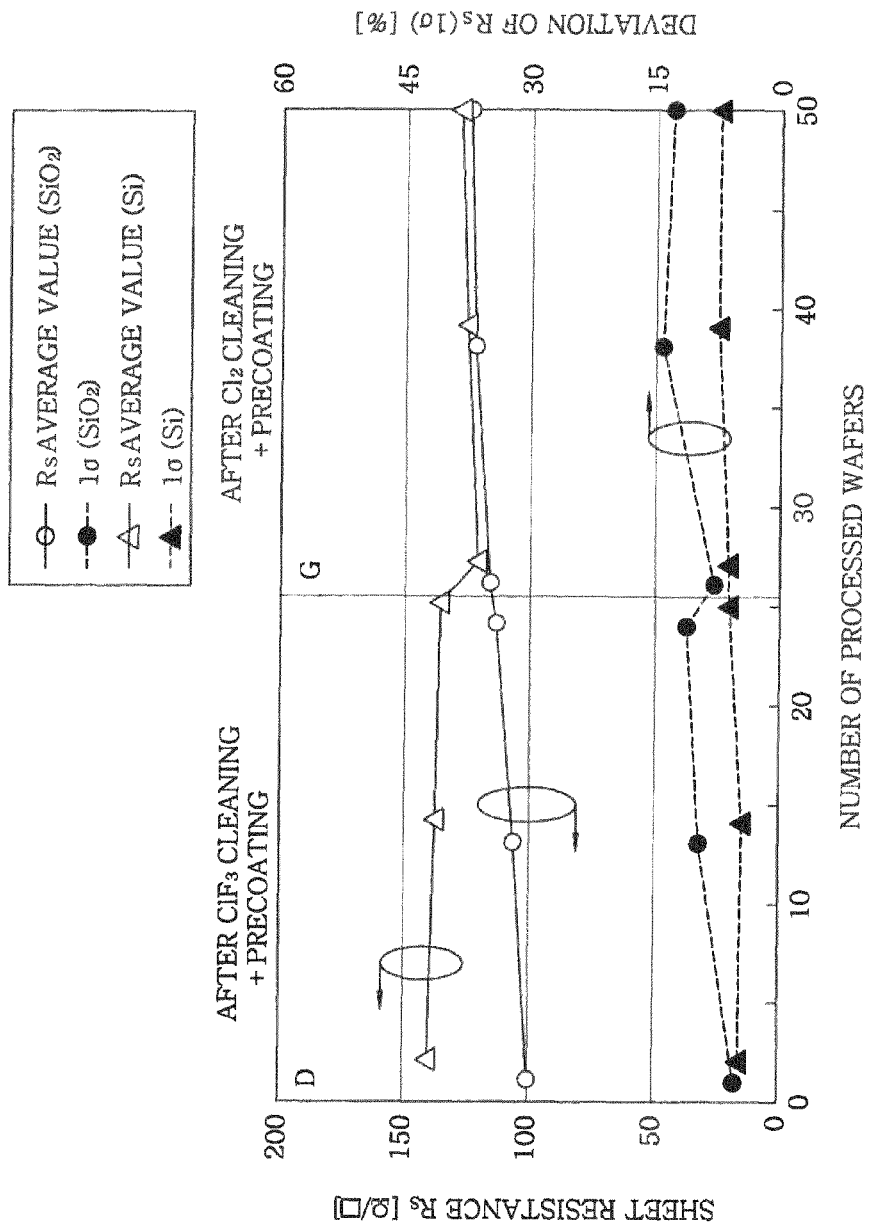
FIG. 13 is a graph showing resistance values of Ti films formed on 25 wafers after cleaning using $ClF_3$ gas and pre-coating and variation thereof and resistance values of Ti films formed on 25 wafers after cleaning using $Cl_2$ gas and pre-coating and variation thereof.

FIG. 13 shows resistance values of films and variation thereof in the steps D and G. As shown in FIG. 13, in the film formation after the $Cl_2$ gas cleaning, the resistance values on Si and $SiO_2$ and the variation thereof were same as those obtained after the $ClF_3$ gas cleaning.

Moreover, the present invention can be variously modified without being limited to the above embodiment. For example, in the above embodiment, the present invention is applied to a TiN film formation by thermal CVD and a Ti film formation by plasma CVD. However, the present invention is not limited thereto. Furthermore, in the above embodiment, a Ti film and a TiN film are formed by using $TiCl_4$ gas as a metal chloride compound gas. However, it is also possible to form another metal film or metal compound film by using another metal chloride compound gas. For example, it is possible to form a TaN film used as a barrier film by thermal CVD by using TaCl$_5$ gas and NH$_3$ gas, and a Ta film used as a barrier film by plasma CVD by using TaCl$_5$ gas and H$_2$ gas.

Further, a target substrate is not limited to a semiconductor wafer, and may be, e.g., a substrate for use in a flat panel display (FPD) represented by a substrate for use in a liquid crystal display (LCD) or the like.

What is claimed is:

1. A film formation method, comprising:
    forming a metal film or a metal compound film by CVD on a surface of a target substrate mounted on a substrate mounting table in a chamber by supplying a processing gas containing a metal chloride compound gas into the chamber from a gas ejection member provided in the chamber in a state where an interior of the chamber is exhausted and a temperature of the substrate mounting table is set to a predetermined temperature; and
    cleaning the interior of the chamber by supplying a cleaning gas containing Cl$_2$ gas from the gas ejection member into the chamber containing no target substrate,
    wherein during the cleaning, a pressure in the chamber is controlled and temperatures of the substrate mounting table, the gas ejection member, and a wall portion of the chamber are independently controlled, such that a temperature of a cleaning target portion is higher than or equal to a decomposition start temperature of Cl$_2$ gas and a temperature of a non-cleaning target portion is lower than the decomposition start temperature, so that deposits formed on the cleaning target portion are removed in a reaction rate controlled regime and corrosion of the non-cleaning target portion is prevented from occurring, and
    wherein the cleaning includes an initial step of performing cleaning in a rate of arrival controlled regime and a next step of removing deposits that have not been removed in the initial step in the reaction rate controlled regime.

2. The film formation method of claim 1, wherein the metal chloride compound gas is TiCl$_4$ gas, and the metal is Ti.

3. The film formation method of claim 2, wherein the processing gas contains TiCl$_4$ gas and nitrogen-containing gas,
    and wherein in the film forming process, a TiN film as a metal compound film is formed by thermal CVD on the surface of the target substrate while setting the temperature of the substrate mounting table to be in a range from about 400 to 700° C. and the temperatures of the gas ejection member and the wall portion of the chamber to be in a range from about 150 to 250° C., at which a by-product is hardly adhered,
    and wherein in the cleaning process, the substrate mounting table is the cleaning target portion, so that the temperature thereof is controlled to be higher than or equal to a decomposition start temperature of Cl$_2$ gas, and the gas ejection member and the wall portion of the chamber are the non-cleaning target portions, so that the temperatures thereof are controlled to a temperature lower than the decomposition start temperature of Cl$_2$ gas and close to a film forming temperature.

4. The film formation method of claim 2, wherein the processing gas contains TiCl$_4$ gas and a reduction gas,
    and wherein in the film forming process, a Ti film as a metal film is formed by plasma CVD on the surface of the target substrate while setting the temperatures of the substrate mounting table, the gas ejection member and the wall portion of the chamber to be from about 400 to 700° C., be from about 400 to 500° C. and be from about 150 to 250° C., respectively,
    and wherein in the cleaning process, the substrate mounting table and the gas ejection member are the cleaning target portions, so that the temperatures thereof are controlled to be higher than or equal to a decomposition start temperature of Cl$_2$ gas and the wall portion of the chamber is the non-cleaning target portion, so that the temperature thereof is controlled to be lower than the decomposition start temperature.

5. The film formation method of claim 1, wherein in the cleaning process, the cleaning of the wall portion of the chamber is assisted by converting the cleaning gas into a plasma.

6. The film formation method of claim 5, wherein the cleaning gas is converted into a plasma by using a remote plasma source.

7. The film formation method of claim 1, wherein the cleaning gas further contains a reducing agent.

8. The film formation method of claim 1, wherein the cleaning gas further contains ClF$_3$ gas.

9. The film formation method of claim 1, wherein the cleaning process is performed while setting the temperature of the cleaning target portion to a temperature close to the film forming temperature.

10. A cleaning method for cleaning an interior of a chamber after forming a metal film or a metal compound film on a surface of a target substrate mounted on a substrate mounting table in the chamber by supplying a processing gas containing a metal chloride compound gas into the chamber from a gas ejection member provided in the chamber in a state where an interior of the chamber is exhausted and a temperature of the substrate mounting table is set to a predetermined temperature, the method comprising:
    introducing a cleaning gas containing Cl$_2$ into the chamber containing no target substrates; and
    controlling the temperatures of the substrate mounting table, the ejection member, and the wall portion of the chamber independently and controlling a pressure in the chamber such that a temperature of a cleaning target portion is higher than or equal to a decomposition start temperature of Cl$_2$ gas and a temperature of a non-cleaning target portion is lower than the decomposition start temperature of Cl$_2$ gas, so that deposits formed on the cleaning target portion are removed in a reaction rate controlled regime and corrosion of the non-cleaning target portion is prevented from occurring,
    wherein the cleaning method further includes an initial step of performing cleaning in a rate of arrival controlled regime and a next step of removing deposits that have not been removed in the initial step in the reaction rate controlled regime.

11. The cleaning method of claim 10, wherein the metal chloride compound gas is TiCl$_4$ gas, and the metal is Ti.

12. The cleaning method of claim 10, wherein the cleaning of the wall portion of the chamber is assisted by converting the cleaning gas into a plasma.

13. The cleaning method of claim 12, wherein the cleaning gas is converted into a plasma by using a remote plasma.

14. The cleaning method of claim 10, wherein the cleaning gas further contains a reducing agent.

15. The cleaning method of claim 10, wherein the cleaning gas further contains ClF$_3$ gas.

16. The cleaning method of claim 10, wherein the temperature of the cleaning target portion is set to a temperature close to a film forming temperature.

* * * * *